US008339121B2

(12) United States Patent
Su et al.

(10) Patent No.: US 8,339,121 B2
(45) Date of Patent: *Dec. 25, 2012

(54) OSCILLOGRAPH AND SIGNAL IDENTIFYING METHOD OF A SERIAL DATA BUS USING THE OSCILLOGRAPH

(75) Inventors: Wang-Ding Su, Taipei Hsien (TW); Jui-Hsiung Ho, Taipei Hsien (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 389 days.

This patent is subject to a terminal disclaimer.

(21) Appl. No.: 12/646,886

(22) Filed: Dec. 23, 2009

(65) Prior Publication Data

US 2011/0050205 A1 Mar. 3, 2011

(30) Foreign Application Priority Data

Aug. 28, 2009 (CN) .......................... 2009 1 0306258

(51) Int. Cl.
*G01R 13/00* (2006.01)
*G01R 23/16* (2006.01)

(52) U.S. Cl. ..................... 324/140 R; 324/76.12; 702/69

(58) Field of Classification Search .... 324/76.12–76.83, 324/121 R, 121 E, 140 R, 141, 142, 140 D; 701/67–79, 117

See application file for complete search history.

(56) References Cited

U.S. PATENT DOCUMENTS

| 6,311,138 B2* | 10/2001 | Miller .............................. 702/67 |
| 6,571,185 B1* | 5/2003 | Gauland et al. ................. 702/68 |
| 6,584,419 B1* | 6/2003 | Alexander ....................... 702/68 |
| 6,624,829 B1* | 9/2003 | Beck et al. ..................... 715/771 |
| 6,690,398 B1* | 2/2004 | Beck et al. ..................... 715/771 |
| 6,760,673 B2* | 7/2004 | Genther et al. ................. 702/75 |
| 6,804,620 B1* | 10/2004 | Larson et al. .................... 702/91 |
| 6,892,150 B2* | 5/2005 | Pickerd et al. .................. 702/67 |
| 7,373,263 B2* | 5/2008 | Cohn et al. ...................... 702/57 |
| 8,055,464 B2* | 11/2011 | Rule et al. ........................ 702/68 |
| 8,219,339 B2* | 7/2012 | Hamre et al. .................... 702/69 |
| 2005/0225310 A1* | 10/2005 | Smith et al. .............. 324/121 R |
| 2010/0244811 A1* | 9/2010 | Pupalaikis et al. ......... 324/76.23 |
| 2011/0057643 A1* | 3/2011 | Su et al. ..................... 324/76.39 |
| 2011/0121818 A1* | 5/2011 | Fefer et al. ............... 324/121 R |

* cited by examiner

*Primary Examiner* — Joshua Benitez Rosario
(74) *Attorney, Agent, or Firm* — Altis Law Group, Inc.

(57) ABSTRACT

An oscillograph can identify signals of a serial data bus. The signal identifying method triggers communication channels of the oscillograph, measures a rise time and a fall time for each captured signal, and sets a sender terminal (ST) and a receiver terminal (RT) for each of the captured signals according to the measured results. The signal identifying method determines the ST and RT for each of the captured signals after the oscillograph is triggered. If the determined ST of each of the acquired signals is identical to the set ST and the determined RT of the each of the acquired signals is identical with the set RT, the signal identifying process is completed and a report is generated to record the signal identifying result.

17 Claims, 3 Drawing Sheets

OSCILLOGRAPH AND SIGNAL IDENTIFYING METHOD OF A SERIAL DATA BUS USING THE OSCILLOGRAPH

BACKGROUND

1. Technical Field

Embodiments of the present disclosure generally relate to signal identifying methods, and more particularly to a signal identifying method for a serial data bus using an oscillograph.

2. Description of Related Art

A serial data bus test is generally performed using an oscillograph. In order to accomplish the serial data bus test, the oscillograph measures signals from the serial data bus, identifies time sequence of the captured signals from each communication channel, and determines a sender port and a receiver port for each of the captured signals accordingly. The signal identifying process is performed manually after waveforms of the captured signals is displayed on the oscillograph. However, manual identifying has many shortcomings, such as: (a) signal identifying visually is often error prone; (b) a plurality of captured signals cannot be identified synchronously; and (c) inconsistent results because of human operator.

What is needed, therefore, is a signal identifying method to overcome the aforementioned problems.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

In general, the word "module," as used herein, refers to logic embodied in hardware or firmware, or to a collection of software instructions, written in a programming language, such as, for example, Java, C, or assembly. One or more software instructions in the modules may be embedded in firmware, such as an EPROM. It will be appreciated that modules may comprised connected logic units, such as gates and flip-flops, and may comprise programmable units, such as programmable gate arrays or processors. The modules described herein may be implemented as either software and/or hardware modules and may be stored in any type of computer-readable medium or other computer storage device.

Figure 1:
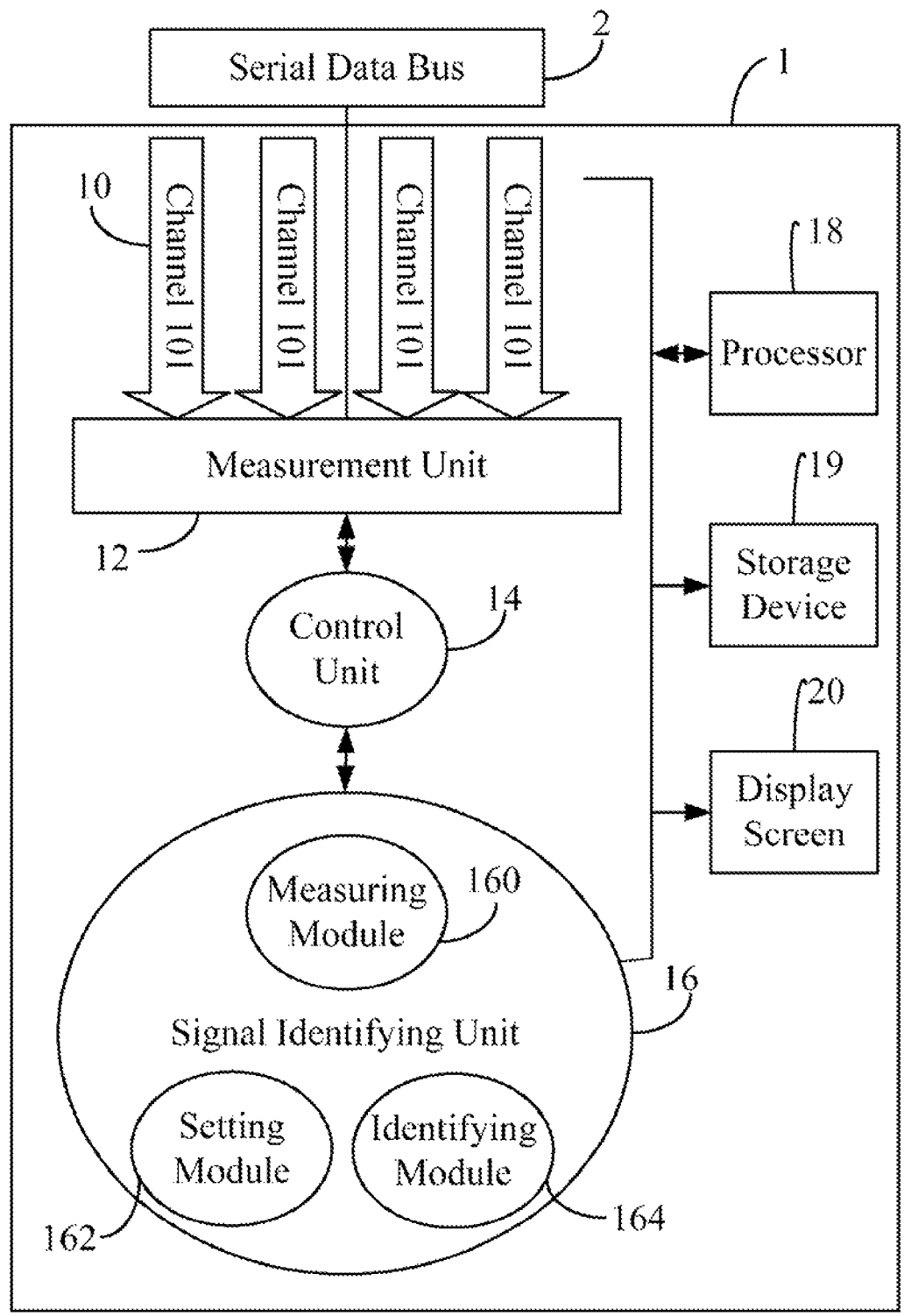
FIG. 1 is a block diagram of one embodiment of an oscillograph.

FIG. 1 is a block diagram of one embodiment of an oscillograph 1. The oscillograph 1 typically includes at least four communication channels 10 labeled channel 101, channel 102, channel 103 and channel 104, a measurement unit 12, a control unit 14, and a signal identifying unit 16. In the embodiment, the oscillograph 1 connects to a serial data bus 2 via the at least four communication channels 10. The oscillograph 1 is operable to perform a signal identifying process on the serial data bus 2 by using the measurement unit 12, the control unit 14, and the signal identifying unit 16. For example, the measurement unit 12 communicates with the serial data bus 2 to obtain signals of the serial data bus 2. The control unit 14 controls the oscillograph 1 to capture the signals (hereinafter referred to as "captured signals") transmitted by each of the at least four communication channels 10. The signal identifying unit 16 performs the signal identifying process on each of the captured signals and generates a report to record signal identifying results. The signal identifying method will be described in greater detail below.

The oscillograph 1 further includes at least one processor 18, a storage device 19, and a display screen 20. Each of the measurement unit 12, the control unit 14, and the signal identifying unit 16 may include one or more computerized instructions or codes that are stored in the storage device 19 and can be executed by the at least one processor 18. The storage device 19 may be a hard disk drive, a compact disc, a digital video disc, or a tape drive.

In the embodiment, the signal identifying unit 16 may include a measuring module 160, a setting module 162, and an identifying module 164. One or more computerized codes of the measuring module 160, a setting module 162, and an identifying module 164 may be stored in the storage device 19, and can be executed by the at least one processor 18.

The measuring module 160 is operable to use an edge-trigger to trigger each of the at least four communication channels 10 for transmitting the captured signals, and to measure a rise time and a fall time of each of the captured signals in a sender terminal (ST) and a receiver terminal (RT).

For example, if the serial data bus 2 tests a connection between a pin "a" and a pin "b," the measurement unit 12 communicates with the serial data bus 2 to obtain captured signals of the serial data bus 2 via one of the at least four communication channels 10. The captured signals include the captured signals communicated from the pin "a" to the pin "b" or the captures signals communicated from the pin "b" to the pin "a." The measuring module 160 measures the rise time and the fall time of each of the captured signals at the pin "a," and measures the rise time and the fall time of each of the captured signals at the pin "b."

The setting module 162 is operable to set a ST and a RT for the each of the captured signals according to the measured results. In the embodiment, the rise time and fall time of one captured signal in the ST is larger than those in the RT.

The identifying module 164 is operable to set a plurality of trigger parameters that trigger the oscillograph 1, acquire the captured signals in according to the trigger parameters, and determine the ST and RT for each of the acquired signals. In the embodiment, the trigger parameters may include a trigger mode of the oscillograph 1, a signal transmitting channel, an upper level, a lower level, a trigger time and a signal analyzing type of the acquired signals. In one embodiment, the trigger mode of the oscillograph 1 is a level trigger. The trigger time is the time offset between the rise time of one of the captured signals in the ST and the rise time of the one of the captured signals in the RT. In another embodiment, the trigger time is the time offset between the fall time of one of the captured signals in the ST and the fall time of the one of the captured signals in the RT.

In the embodiment, the identifying module 164 is further operable to compare the determined ST of each of the acquired signals with the set ST of each of the acquired signals, and compare the determined RT of each of the acquired signals with the set RT of each of the acquired signals. If the determined ST of each of the acquired signals is identical with the set ST of the acquired signal and the determined RT of the each of the acquired signals is identical with the set RT of the acquired signal, the identifying module 164 determines that the signal identifying process of the serial data bus 1 is completed, generates a report to record the signal identifying result of each of the acquired signals, and displays the report on the display screen 20.

Figure 2:
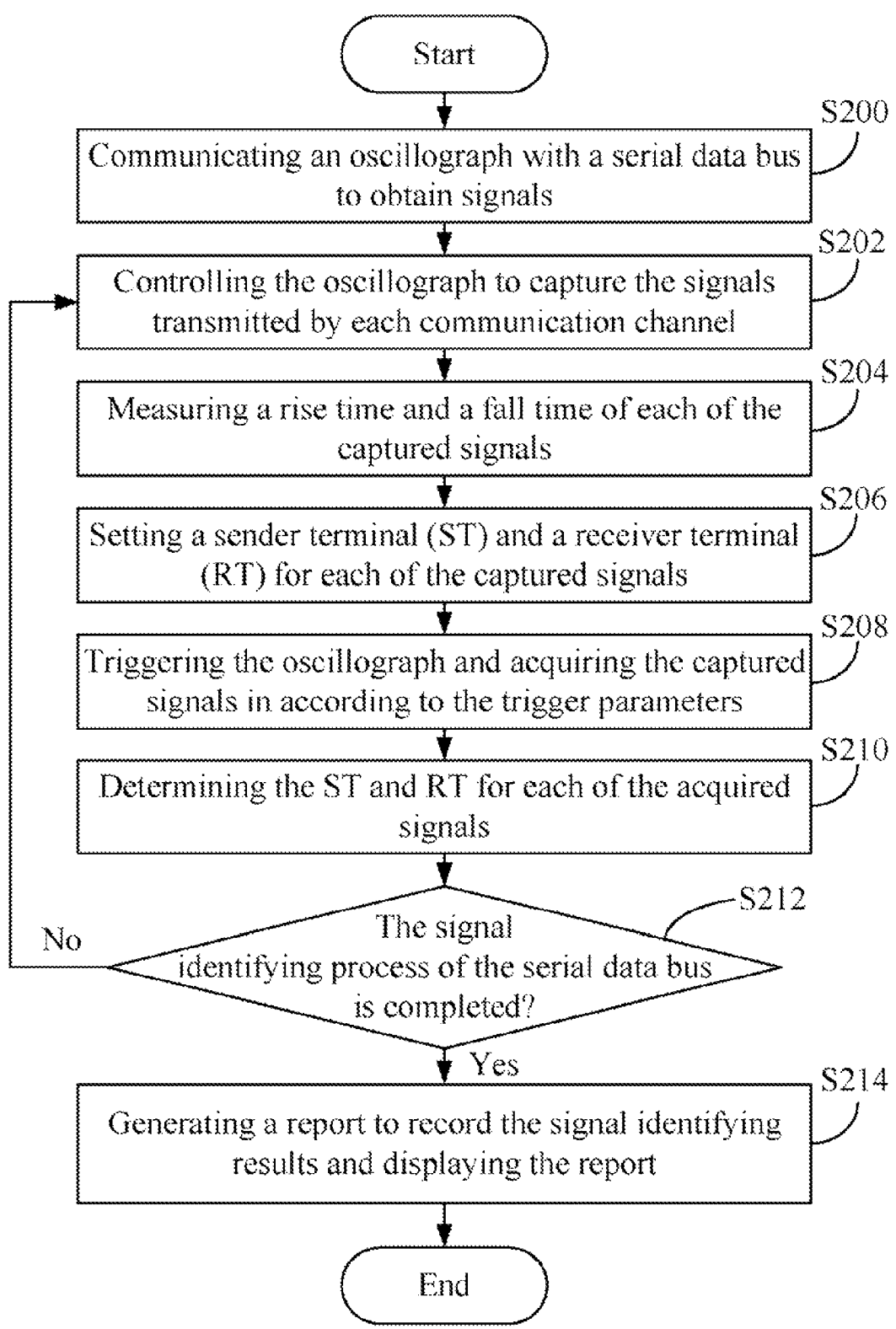
FIG. 2 is a flowchart illustrating one embodiment of a signal identifying method for a serial data bus by using the oscillograph of FIG. 1.

FIG. 2 is a flowchart illustrating one embodiment of a signal identifying method for the serial data bus 2 by using the oscillograph 1 of FIG. 1.

In block S200, the measurement unit 12 communicates with the serial data bus 2, to obtain signals.

In block S202, the control unit 14 controls the oscillograph 1 to capture the signals through each of the at least four communication channels 10.

Figure 3:
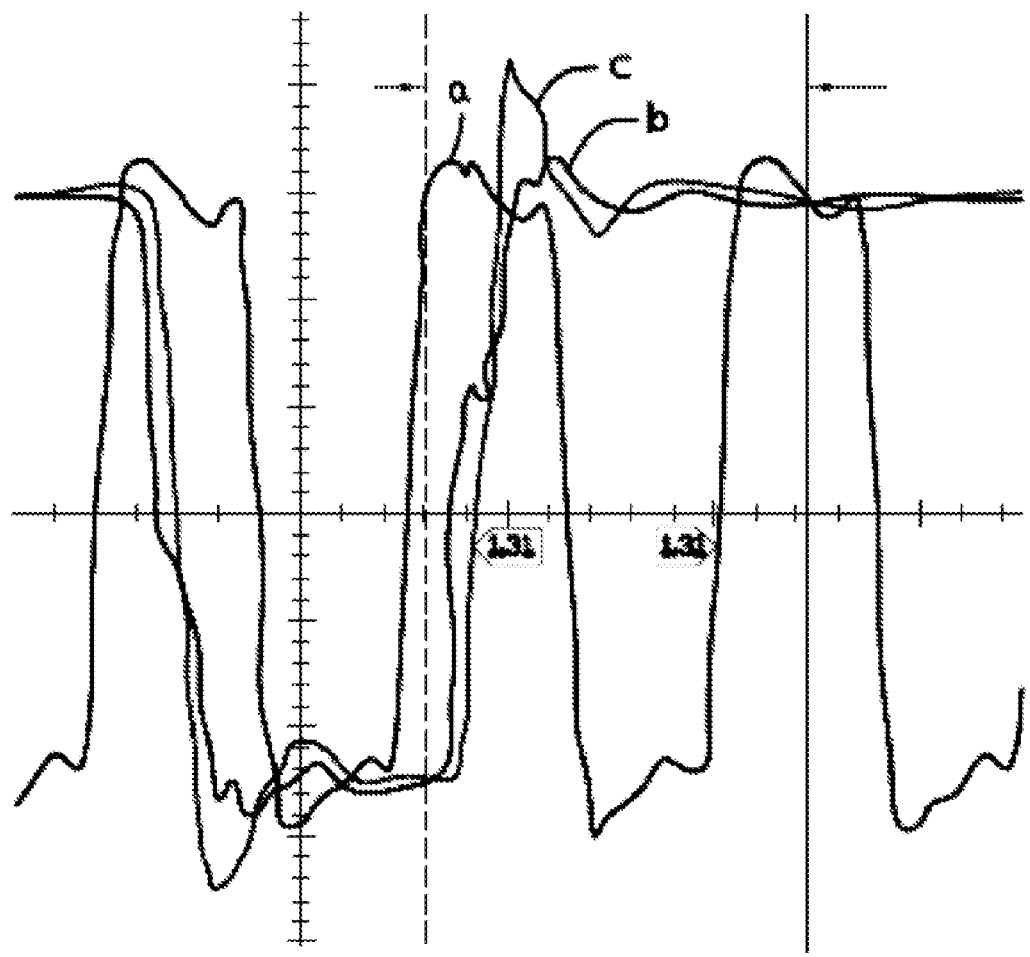
FIG. 3 is a schematic and graphical diagram of measured results of one captured signal via implementing the embodiment of the method of FIG. 2.

In block S204, the measuring module 160 uses an edge-trigger to trigger the at least four communication channels 10, and measures a rise time and a fall time for each of the captured signals in both two transmitting terminals. In the embodiment, the two transmitting terminals may include a sender terminal (ST) and a receiver terminal (RT) of each of the captured signals. As illustrated in FIG. 3, a curve "a" indicates the schematic and graph diagram of a clock signal at different times, a curve "b" indicates the schematic and graph diagram of a captured signal in the RT, and a curve "c" indicates the schematic and graph diagram of the captured signal in the ST.

In block S206, the setting module 162 sets a ST and a RT for the each of the captured signals according to the measured results. In the embodiment, the rise time and fall time of one signal in the ST is larger than those in the RT.

In block S208, the identifying module 164 sets a plurality of trigger parameters to trigger the oscillograph 1, and acquires the captured signals in according to the trigger parameters. In the embodiment, the trigger parameters may include a trigger mode of the oscillograph 1, a signal transmitting channel, an upper level, a lower level, a trigger time and a signal analyzing type of the acquired signals. In one embodiment, the trigger mode of the oscillograph 1 is a level trigger.

In block S210, the identifying module 164 determines the ST and RT for each of the acquired signals.

In block S212, the identifying module 164 determines whether the signal identifying process is completed by comparing the determined ST of each of the acquired signals with the set ST of each of the acquired signals, and by comparing the determined RT of each of the acquired signals with the set RT of each of the acquired signals.

If the determined ST of any acquired signal is not identical with the set ST of the acquired signals, or if the determined RT of the acquired signal is not identical with the set RT of the acquired signal, the signal identifying process of the serial data bus 1 is uncompleted, the flow returns to block S202.

Otherwise, if the determined ST of each of the acquired signals is identical with the set ST of each of the acquired signals and the determined RT of each of the acquired signals is identical with the set RT of each of the acquired signals, that is, the signal identifying process of the serial data bus 1 is completed, in block S214, the identifying module 164 generates a report to record the signal identifying result of each of the acquired signals, and displays the report on the display screen 20.

For example, if the determined ST of a acquired signal "A" is identical with the set ST of the acquired signal "A," and the determined RT of the acquired signal "A" is identical with the set RT of the acquired signal "A," the identifying module 164 determines the acquired signal "A" is identified completely. If all of the acquired signals of the serial data bus 1 are identified completely, the identifying module 164 determines that the signal identifying process of the serial data bus 1 is completed.

Although certain inventive embodiments of the present disclosure have been specifically described, the present disclosure is not to be construed as being limited thereto. Various changes or modifications may be made to the present disclosure without departing from the scope and spirit of the present disclosure.

What is claimed is:

1. A signal identifying method for a serial data bus using an oscillograph, the method comprising:
    communicating with the serial data bus to obtain signals of the serial data bus;
    controlling the oscillograph to capture the signals through a plurality of communication channels of the oscillograph;
    triggering the communication channels transmitting the captured signals, and measuring a rise time and a fall time of each of the captured signals;
    setting a sender terminal (ST) and a receiver terminal (RT) for each of the captured signals according to the following conditions: the rise time of each captured signal in the ST is larger than the rise time of corresponding captured signal in the RT, and the fall time of each captured signal in the ST is larger than the fall time of corresponding captured signal in the RT;
    setting a plurality of trigger parameters to trigger the oscillograph, and acquiring the captured signals according to the trigger parameters;
    determining the ST and RT for each of the acquired signals;
    determining the signal identifying process of the serial data bus is completed when the determined ST of each of the acquired signals is identical to the set ST of the acquired signal and the determined RT of the each of the acquired signals is identical to the set RT of the acquired signal; and
    generating a report to record the signal identifying result of each of the acquired signals when the signal identifying process is completed, and displaying the report on a display screen of the oscillograph.

2. The method as described in claim 1, wherein each of the communication channels is triggered by an edge-trigger.

3. The method as described in claim 1, wherein the trigger parameters comprise a trigger mode of the oscillograph, a signal transmitting channel, an upper level, a lower level, a trigger time and a signal analyzing type of the captured signals.

4. The method as described in claim 3, wherein the trigger mode of the oscillograph is a level trigger.

5. The method as described in claim 3, wherein the trigger time is the time offset between the rise time of one of the captured signals in the ST and the rise time of the one of the captured signals in the RT, or the time offset between the fall time of one of the captured signals in the ST and the fall time of the one of the captured signals in the RT.

6. An oscillograph, comprising:
    at least four communication channels being connected to a serial data bus;
    a communication unit operable to communicate with the serial data bus to obtain signals of the serial data bus;
    a control unit operable to control the oscillograph to capture the signals through each of the at least four communication channels; and
    a time sequence identifying unit, comprising:
        a measuring module operable to trigger each of the at least four communication channels for transmitting the captured signals, and measure a rise time and a fall time of each of the captured signals;

a setting module operable to set a sender terminal (ST) and a receiver terminal (RT) for the each of the captured signals according to the following conditions: wherein the rise time of each captured signal in the ST is larger than the rise time of corresponding captured signal in the RT, and the fall time of each captured signal in the ST is larger than the fall time of corresponding captured signal in the RT;

an identifying module operable to set a plurality of trigger parameters to trigger the oscillograph, acquire the captured signals according to the trigger parameters, determine the ST and RT for each of the acquired signals, determine that the signal identifying process is completed when the determined ST of each of the acquired signals is identical to the set ST of the acquired signal and the determined RT of the each of the acquired signals is identical to the set RT of the acquired signal.

7. The oscillograph as described in claim 6, wherein the identifying module is further operable to generate a report to record the signal identifying result of each of the acquired signals when the signal identifying process is completed, and displaying the report on a display screen of the oscillograph.

8. The oscillograph as described in claim 6, wherein each of the communication channels is triggered by an edge-trigger.

9. The oscillograph as described in claim 6, wherein the trigger parameters comprise a trigger mode of the oscillograph, a signal transmitting channel, an upper level, a lower level, a trigger time and a signal analyzing type of the captured signals.

10. The oscillograph as described in claim 9, wherein the trigger mode of the oscillograph is a level trigger.

11. The oscillograph as described in claim 9, wherein the trigger time is the time offset between the rise time of one of the captured signals in the ST and the rise time of the one of the captured signals in the RT, or the time offset between the fall time of one of the captured signals in the ST and the fall time of the one of the captured signals in the RT.

12. The oscillograph as described in claim 9, wherein the triggering module is further operable to compare the determined ST of each of the acquired signals with the set ST and comparing the determined RT of each of the acquired signals with the set RT.

13. A non-transitory storage medium having stored thereon instructions that, when executed by a processor of an oscillograph, causing the oscillograph to complete a signal identifying method for a serial data bus, wherein the method comprises:

communicating with the serial data bus to obtain signals of the serial data bus;

controlling the oscillograph to capture the signals through a plurality of communication channels of the oscillograph;

triggering the communication channels transmitting the captured signals, and measuring a rise time and a fall time of each of the captured signals;

setting a sender terminal (ST) and a receiver terminal (RT) for each of the captured signals according to the following conditions: the rise time of each captured signal in the ST is larger than the rise time of corresponding captured signal in the RT, and the fall time of each captured signal in the ST is larger than the fall time of corresponding captured signal in the RT;

setting a plurality of trigger parameters to trigger the oscillograph, and acquiring the captured signals according to the trigger parameters;

determining the ST and RT for each of the acquired signals;

determining the signal identifying process of the serial data bus is completed when the determined ST of each of the acquired signals is identical to the set ST of the acquired signal and the determined RT of the each of the acquired signals is identical to the set RT of the acquired signal; and generating a report to record the signal identifying result of each of the acquired signals when the signal identifying process is completed, and displaying the report on a display screen of the oscillograph.

14. The non-transitory storage medium as described in claim 13, wherein each of the communication channels is triggered by an edge-trigger.

15. The non-transitory storage medium as described in claim 13, wherein the trigger parameters comprise a trigger mode of the oscillograph, a signal transmitting channel, an upper level, a lower level, a trigger time and a signal analyzing type of the captured signals.

16. The non-transitory storage medium as described in claim 15, wherein the trigger mode of the oscillograph is a level trigger.

17. The non-transitory storage medium as described in claim 15, wherein the trigger time is the time offset between the rise time of one of the captured signals in the ST and the rise time of the one of the captured signals in the RT, or the time offset between the fall time of one of the captured signals in the ST and the fall time of the one of the captured signals in the RT.

\* \* \* \* \*